(12) United States Patent
Gao

(10) Patent No.: US 11,737,237 B2
(45) Date of Patent: Aug. 22, 2023

(54) LIQUID COOLING DESIGN FOR PERIPHERAL ELECTRONICS

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 101 days.

(21) Appl. No.: 17/166,175

(22) Filed: Feb. 3, 2021

(65) Prior Publication Data

US 2022/0248565 A1 Aug. 4, 2022

(51) Int. Cl.
*H05K 7/20* (2006.01)
*H05K 7/16* (2006.01)
*H05K 7/12* (2006.01)

(52) U.S. Cl.
CPC .......... *H05K 7/20254* (2013.01); *H05K 7/12* (2013.01); *H05K 7/16* (2013.01); *H05K 7/20272* (2013.01)

(58) Field of Classification Search
CPC ........ H05K 7/20254; H05K 7/12; H05K 7/16; H05K 7/20; H05K 7/272; H05K 7/20272; G06F 2200/201; G06F 1/185; G06F 1/20
See application file for complete search history.

(56) References Cited

U.S. PATENT DOCUMENTS

| | | | | |
|---|---|---|---|---|
| 4,771,366 A | * | 9/1988 | Blake | H05K 7/023 257/713 |
| 5,537,343 A | * | 7/1996 | Kikinis | G06F 1/183 361/679.41 |
| 8,004,841 B2 | * | 8/2011 | Cipolla | F28D 15/0233 174/15.1 |
| 9,345,169 B1 | * | 5/2016 | Campbell | H05K 7/20327 |
| 9,786,578 B2 | * | 10/2017 | Cox | F28D 15/0275 |
| 10,021,814 B2 | * | 7/2018 | Aoki | H05K 7/20763 |
| 10,111,365 B1 | * | 10/2018 | Junkins | G11B 33/1426 |
| 10,499,488 B1 | * | 12/2019 | Tsai | H05K 1/144 |
| 10,763,191 B1 | * | 9/2020 | Franz | F16F 1/027 |

(Continued)

FOREIGN PATENT DOCUMENTS

| | | |
|---|---|---|
| JP | H05304381 A | 11/1993 |
| JP | 2001196516 A * | 7/2001 |

(Continued)

OTHER PUBLICATIONS

Koike Hiroko, "Heat Spreader", Jul. 19, 2001, Translation of JP2001196516 (entire document) (Year: 2001).*

*Primary Examiner* — Stephen S Sul
(74) *Attorney, Agent, or Firm* — Womble Bond Dickinson (US) LLP

(57) ABSTRACT

A liquid cooling arrangement for peripheral board incorporates cooling plates on one side and resilient cushion on the opposite side and enclosing the peripheral board between the cooling plates and the cushion. The cushion exerts pressure on the backside of the peripheral board to ensure physical contact of the microchips and the cooling plates for good thermal conductance. Cooling hoses are connected to the cooling plates to circulate cooling liquid. An electrically insulating layer may be included between the backside of the peripheral board and the cushion. An extension frame may optionally be added onto the cooling frame to house the cooling houses and increase the variability of deployments.

19 Claims, 4 Drawing Sheets

(56) References Cited

U.S. PATENT DOCUMENTS

| | | | |
|---|---|---|---|
| 2009/0002951 A1* | 1/2009 | Legen | H01L 23/427 |
| | | | 165/104.33 |
| 2011/0286179 A1 | 11/2011 | Motschman et al. | |
| 2013/0120926 A1* | 5/2013 | Barina | H01L 23/4093 |
| | | | 165/80.4 |
| 2017/0092921 A1* | 3/2017 | Matsumura | H01M 4/5825 |
| 2018/0375976 A1* | 12/2018 | Kikuchi | H04M 1/0247 |
| 2020/0241609 A1 | 7/2020 | Selvidge et al. | |
| 2021/0251105 A1* | 8/2021 | Lee | H05K 7/20272 |
| 2021/0321526 A1* | 10/2021 | Kulkarni | H05K 7/20772 |
| 2022/0003511 A1* | 1/2022 | Embleton | H05K 7/20836 |
| 2022/0053668 A1* | 2/2022 | Ferrer Medina | G06F 1/20 |

FOREIGN PATENT DOCUMENTS

| | | |
|---|---|---|
| JP | 2004146627 A | 5/2004 |
| TW | 200937175 A | 9/2009 |

\* cited by examiner

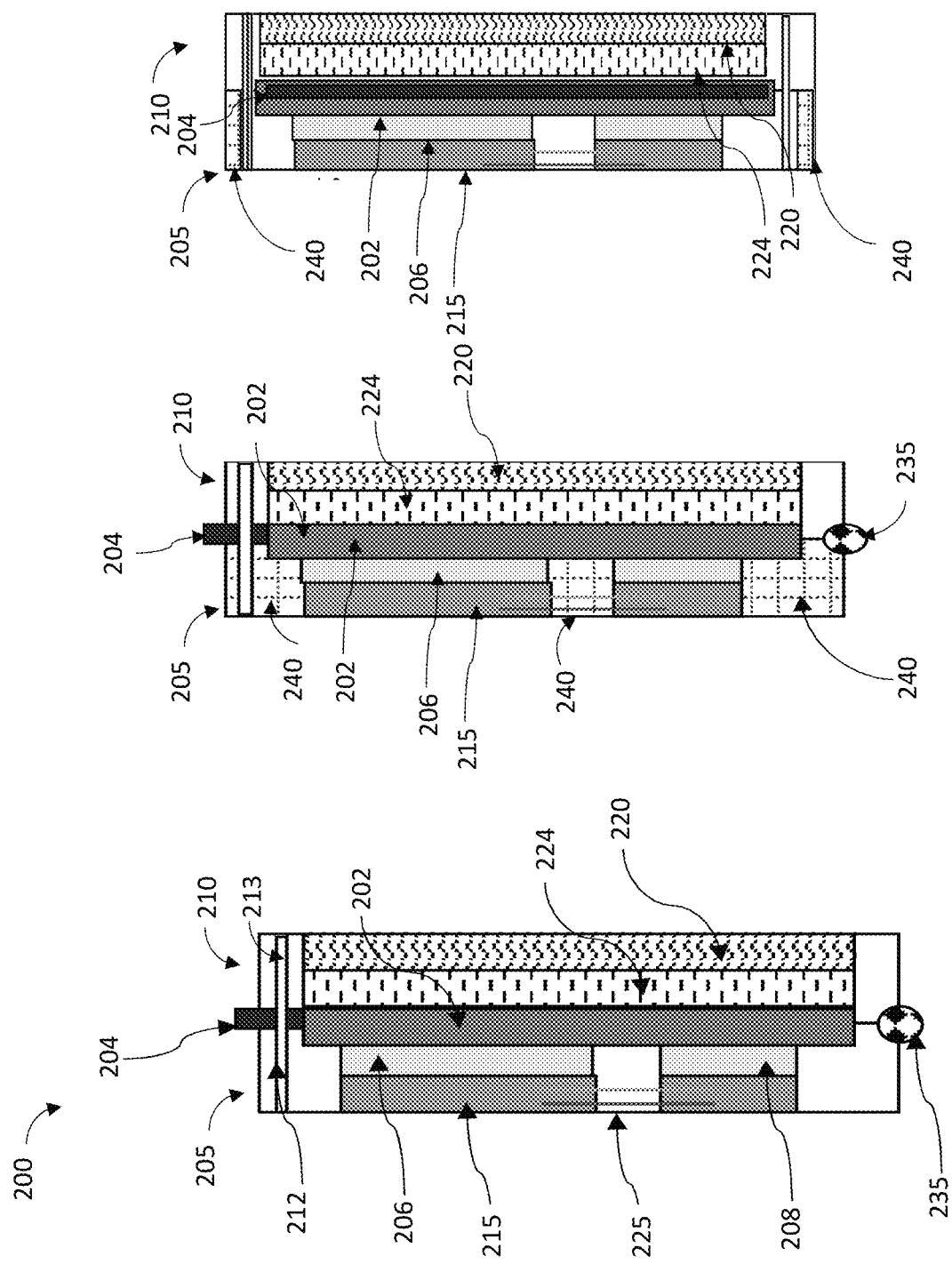

LIQUID COOLING DESIGN FOR PERIPHERAL ELECTRONICS

FIELD OF THE DISCLOSURE

Embodiments of the present disclosure relate generally to architecture for cooling electronic components assembled on a peripheral printed circuit board, such as the ones with PCIe connecting interface based.

BACKGROUND

Generally, computing motherboard includes various interfaces to exchange data with various components. Such interfaces include a peripheral component interconnect (PCI), which accepts a peripheral printed circuit board (PCB). The peripheral PCB is generally smaller than the motherboard and may include electronic devices such as, e.g., graphic processor (GPU), hard disk drive (HHD) host adapters, solid state drive (SSD), WiFi and Ethernet hardware, etc. Various standards may be used with a peripheral component interconnect, such as, PCI, PCI-X, AGP, PCIe (PCI express), etc. The commonality of these standards is that they all enable intercommunication between components mounted on the motherboard and components mounted on the peripheral PCB, with different speeds.

With the increase in modern computational requirements, more and more tasks are offloaded from the main CPU to other components, including components mounted on the peripheral PCB. Consequently, the processing power of the peripheral PCB increases, which increase the demand for energy, thus increasing heat dissipation.

With the more diversity of the workload, the computing architecture becomes more and more heterogenous, and it requires the modern hardware be more flexible to be installed or removed, as well as reconfigured in systems.

A new design is needed for proper cooling arrangement for the microchips mounted on the peripheral PCB, that is easy to assemble, provide proper cooling to the components, and is reliable. In addition, it is a critical need for developing advanced high performance cooling techniques for managing the thermal conditions for these increasing-power electronics.

BRIEF DESCRIPTION OF THE DRAWINGS

Embodiments of the invention are illustrated by way of example and not limitation in the figures of the accompanying drawings in which like references indicate similar elements.

FIG. 2A illustrates the "closed book" arrangement of the cooling apparatus according to an embodiment, while FIG. 2B illustrates a closed book arrangement according to another embodiment.

FIG. 2C is a bottom view of the cooling apparatus in its mounted and closed position, while

DETAILED DESCRIPTION

Figure 1:
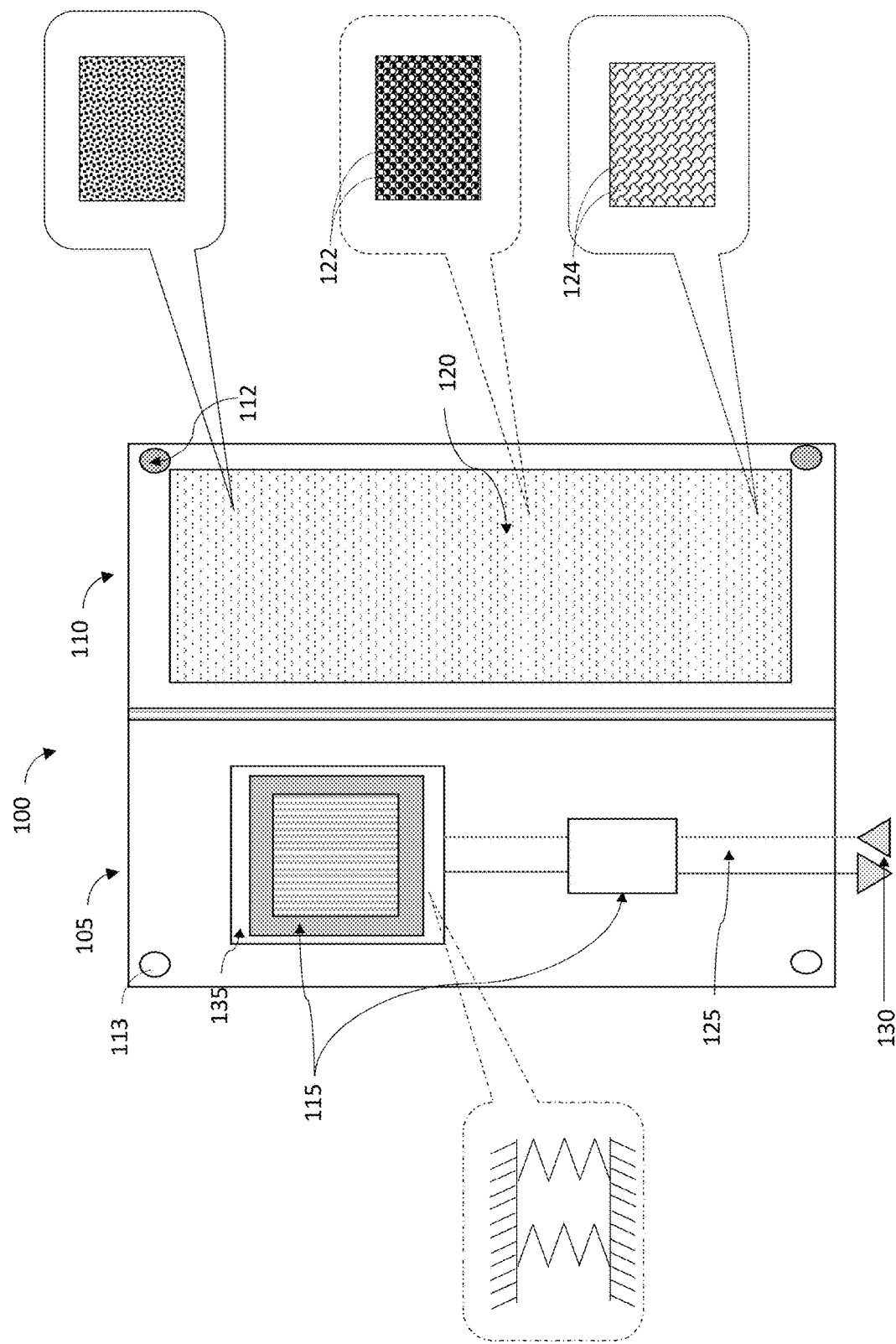
FIG. 1 is a diagram illustrating an example of a cooling apparatus according to an embodiment, showing the "open book" position.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The following detailed description provides examples that highlight certain features and aspects of the innovative cooling design claimed herein. Different embodiments or their combinations may be used for different applications or to achieve different results or benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The current disclosure introduces liquid cooling solutions for the electronic components of peripheral PCBs, such as graphic processors used for intensive compute applications, e.g., artificial intelligence applications and high performance computing applications. Modern peripheral PCB use PCIe connectors for system integration to the motherboard. Such devices use completely different form factors and system integrations, and the cooling system needs to be independent from the cooling applied at the motherboard level. The power of the peripheral devices is constantly increasing to enable better compute performance. Consequently, the corresponding thermal challenges are increasing, especially with increase in packaging density due to the constant increasing power density of the IC and dies. Therefore, proper liquid cooling is important for solving the thermal management of these peripheral devices. However, providing liquid cooling for such peripheral devices presents difficult challenge to design, since it needs to be accommodated within the surrounding systems. In addition, as these are peripheral devices they are naturally required to have high compatibility to different systems' thermal design. Also, the hardware design and implementation for peripheral board cooling are different from the mezzanine based devices.

Disclosed embodiments provide hardware architectures for cooling peripheral devices mounted onto a peripheral PCB. Disclosed embodiments provide robust and reliable cooling solutions, including for systems having multiple peripheral devices. The design includes cooling solutions for the individual peripheral PCBs and full system liquid distribution design. The solution may be easily adaptable to different designs and use cases, and introduces feature that enhance interoperability for different peripheral boards as well as different system hardware environments.

Current technologies rely mainly on air cooling of the peripheral devices. Conversely, disclosed embodiments anticipate the need for enhanced heat removal from peripheral devices and provide architectures for liquid cooling of peripheral devices. The hardware solution incorporates liquid cooling for a single peripheral board or for systems having multiple peripheral boards. Notably, the liquid cooling design for such peripheral devices need to be easy to install, replace, or reconfigure, and should be adaptable to different existing liquid cooling hardware design within the system. Clearly the cooling apparatus should not adversely impacting the performance features of the peripheral devices.

Disclosed embodiments include design of cooling apparatus which includes two frames rotatably attached to a hinge at one side, akin to cover of a book, thus forming an enclosure housing the peripheral board. Prior to assembly the apparatus is in the "open book" position and during assembly the two frames are rotated to a "close book" position, thereby forming a housing enclosing the peripheral board therein—just like the pages of the book are enclosed within the closed cover. As will be explained in more details below, the housing formed by the two frames includes an opening enabling the interface connector of the peripheral board to extend from the opening and mate with the interface socket on the motherboard. In this sense, the peripheral PCB is encapsulated by the cooling apparatus, except for the interface connector extending beyond the cooling apparatus.

A feature of the design is that in addition to providing cooling, it provides physical protection for the peripheral board. In disclosed embodiments, in addition to the cooling function the apparatus enhances the rigidity of the peripheral board, thus enhancing reliability and preventing damage during transport or in harsh vibration environment.

FIG. 1 illustrates an embodiment of a peripheral board cooling apparatus 100 with the two frames 105 and 110 in the open position and without the peripheral board. In this embodiment the cooling devices or units 115, such as cold plates, cooling rails, etc., are mounted on the cooling frame 105 and connected to cooling hoses 125. The cooling hoses 125 have connectors 130 at their ends to connect to a cooling liquid delivery system, which may be any standard liquid cooling delivery system, or may include the liquid cooling system of the motherboard.

The cushion frame 110 has a cushion 120 attached inside, so as to slightly press on the peripheral board when the cooling apparatus is installed on the peripheral board. The cushion 120 may be formed in various forms, but it should have a resilient quality to it so as to apply the required pressure on the peripheral board to ensure good thermal contact of the peripheral devices with the cooling units 115 and add to the rigidity of the assembly. In one example the cushion may be made out of foam, or other flexible structures which provide an averaging pressure and protection on the electronics together with the cooling frame 105. This is exemplified in the solid-line callout. According to another embodiment, illustrated in the dashed-line callout, the cushion is formed by assembling a plurality of springs 122 as an interconnected spring plate or network, such as, e.g., in a spring mattress. According to a further embodiment, shown in the dotted-line callout, the cushion is formed by stamping a metal plate to form therein a plurality of resilient protrusions 124. In some embodiments the cushion 120 is coated with an electrically insulating coating.

Another feature illustrated in FIG. 1, and which may be implemented in any of the other embodiments, is the provision of a resilient mount 135 for the cooling unit 115. In this manner, the cooling unit 115 is not fixedly attached to the frame 105, but is rather resiliently attached to the frame 105, thus allowing it to move slightly to adjust its position to variations in the position of different peripheral components in different peripheral boards. This feature is used for ease of assembly since the design deviation may impact the electronic components on the peripheral board such that it does not perfectly match with the locations of the cooling unit. The disclosed resilient mount structure makes it easier to have a better alignment between the cooling unit and electronic device during the assembly. The resilient mounting assembly may be formed similar to any of the cushions 120, or may incorporate spring elements attached directly to the cooling unit 115, as illustrated in the dash-dot callout. Note, however, that the resilient mount 135 may also impart resilient motion in the direction in and out of the page, i.e., towards and away from the peripheral device to which it contacts, thus accommodating thickness variation of different peripheral devices.

Once the cooling apparatus 100 is folded over a peripheral board, it is secured in the folded position using fasteners 112 attached to complementary fasteners 113, thereby forming an enclosure or a housing. Fasteners 112 and 113 are only provided as one example, but any means of securing the cooling apparatus 100 in its folded position are acceptable. In an embodiment, the selected fasteners parts are attached to the frame as indicated by elements 112 and 113 for ease of assembly, so that no additional screws or fastening parts are needed or need to be added separately.

FIG. 2A is a side view of the cooling apparatus 200 of FIG. 1 in a folded position, housing a peripheral board 202. In the illustrated example the peripheral board 202 includes an interface connector 204, such as a PCIe connector, and has two peripheral devices 206 and 208 (e.g., GPU, ASCI, CPU microchips, chiplets etc.) mounted thereupon. Generally there may be more microchips and circuit elements mounted onto the peripheral board 202; however, since they do not require active cooling they are not shown in the drawings. The two frames 205 and 210 are folded by rotation about hinge 235 so as to encapsulate the peripheral board 202, and are then locked to each other using the matching connectors 212 and 213, or any other suitable locking mechanism. As shown, the cooling frame is positioned over the peripheral device or front-side of the peripheral board 202, while the cushion frame is positioned over the backside of the peripheral board 202. In the mounted and closed position, the cooling devices 215 contact the peripheral devices 206, 208, so as to remove heat therefrom.

The cushion 220 helps ensure proper contact between the cooling devices 215 and the peripheral devices 206, 208, and provide enhanced rigidity to the entire assembly thus protecting the electronic devices. Incidentally, some heat generated by the peripheral devices propagates to the backside of the peripheral board and the cushion may act as a heat sink to remove this heat. FIG. 2A also illustrates an optional contact layer 224 between the cushion 220 and the backside of the peripheral board 202. The contact layer 224 may be an insulating coating provided directly on the cushion 220 or a separate sheet made of an electrically insulating material to prevent any shorts that may be caused by the cushion, in cases where the cushion is made of an electrically conductive material. In certain embodiments it may not be appropriate to have the cushion directly in contact with the backside of the peripheral board and in such cases the optional contact layer 224 is provided as an intervening element. When the contact layer 224 is made of an insulating material, it may also be referred to as an insulating layer.

FIG. 2B illustrates an embodiment similar to that of FIG. 2A, except that perforations or openings 240 are provided along the sides of the frame 205. These perforations or openings 240 are provided to enable air flow through the assembled cooling device and peripheral board, thus providing further heat removal capability, as an example, for other low power density auxiliary components. The openings 240 also provide improved access to the hoses 225 for easier assembly, inspection and service.

Figure 2D:
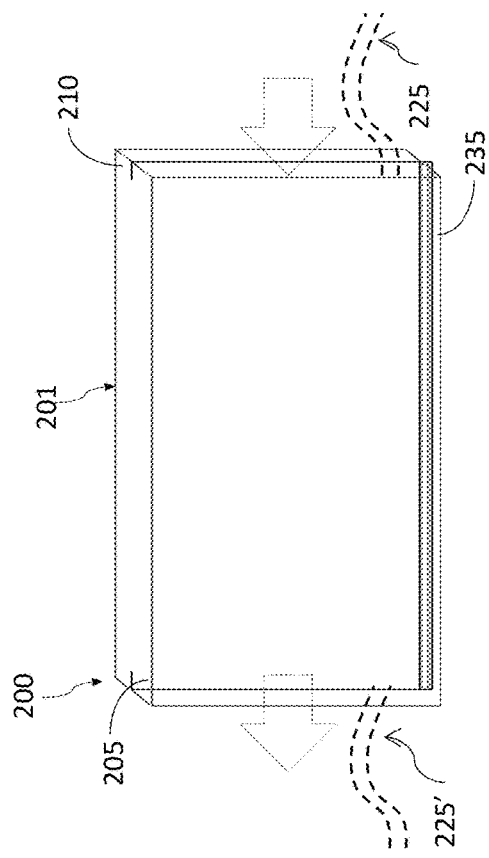
FIG. 2D is a side view thereof.

FIG. 2C is a bottom side view of the cooling apparatus. As illustrated, the interface connector 204 protrudes through a top opening in the cooling apparatus. FIG. 2D is a general schematic showing the two frames in the closed position without the cooling elements or the peripheral board to better illustrate the air flow openings 240 and the top opening 201 for the peripheral connector. The dash-line arrows illustrate air flow to assist in cooling. The hinge 235 is shown at the bottom of the assembly. In this respect, the reference to top and bottom are relative, as the assembly may be installed onto a motherboard in any desired orientation.

Figure 3:
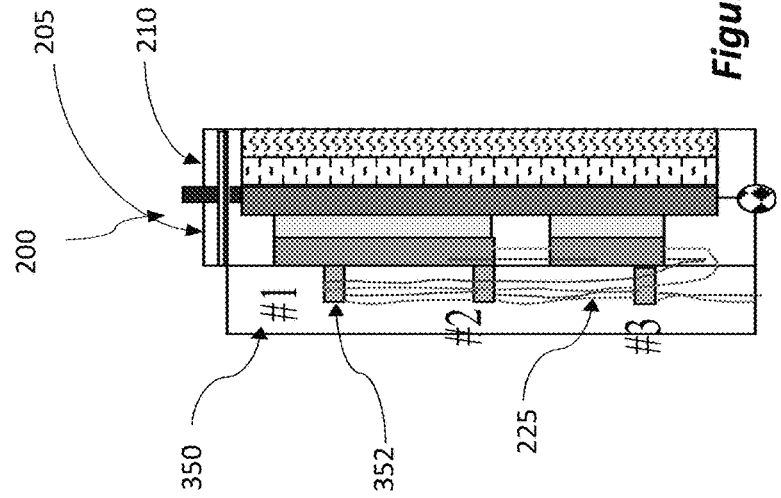
FIG. 3 illustrates an example of a cooling apparatus which includes an extension frame, according to disclosed embodiments.

FIG. 3 illustrates another embodiment that incorporates hose management assembly. In FIG. 3 a hose extension frame 350 may be added to the cooling system over the cooling frame 205. The hose extension frame 350 is used for additional cooling liquid hoses which may be needed in actual use. According to this embodiment the hoses are stored within the hose extension frame 350 before they are connected to deliver cooling liquid. Inside the hose extension frame 350 one or more hose anchors 352 may be provided, three are shown in FIG. 3. Alternatively, rather multiple anchors, a single sliding anchor may be provided, such that the anchor point may be movable or slidable inside the hose extension frame. The anchors may be, for example, clips or posts that assist in arranging the hoses within the frame.

Figure 4:
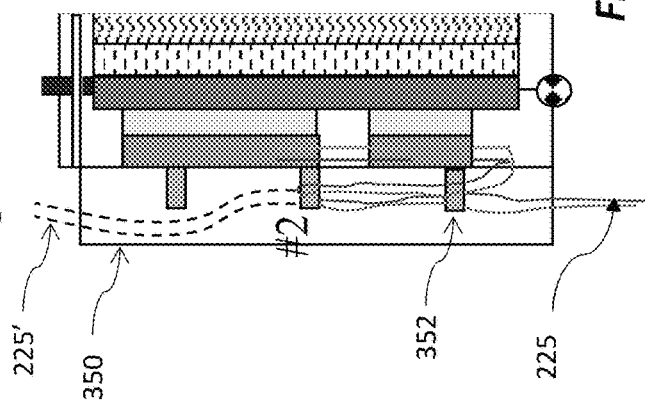
FIG. 4 illustrates operation of the extension frame, according to disclosed embodiments.

As noted, these anchors may be used to manage the hoses. For example, as illustrated in FIG. 3, when the hoses are attached on the anchor position indicated as #1, the hoses are fully stored within the frame, e.g., during shipment. Conversely, as illustrated in FIG. 4, when the hoses are attached to the anchor position shown as #2, the fluid hoses are extended and may be connected to liquid delivery ports. Similarly, if the cooling hoses need to be longer to reach other system integration or connection requirement, then anchor point #3 can be used.

In FIG. 3 three anchors are illustrated, however, different number of anchors may be used and, rather than using several anchors a single anchor 352 may be provided such that it is slidable to, for example, assume the positions indicated by the three anchors in FIG. 3. Thus, for transport the single anchor may be secured at position 1, while during deployment it may be secured at positions indicated as #2 or #3. Moreover, the direction of the outlet for the cooling hoses may be reversible, such that the hoses exit the extension frame at the opposite side as illustrated by dashed-line hoses 225' in FIG. 4. This is also illustrated in FIG. 2D, wherein the hoses may exit either side of the cooling frame, so that on one side the hoses are indicated as 225, while on the opposite side they are indicated as 225'. The ability to flip the exit port of the cooling hoses enables to accommodate different server chassis or different serial/parallel connection of cooling devices.

Figure 5:
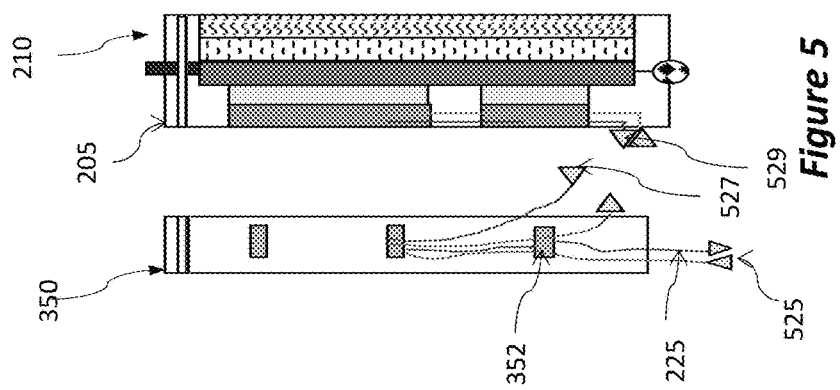
FIG. 5 illustrates an example of modular design of the cooling apparatus, according to an embodiment.

FIG. 5 illustrates an example wherein the hose extension frame 350 is detachable from the cooling frame 205. This provides vast flexibility in deploying the cooling apparatus in different integration arrangements, such that the hose extension frame may or may not be used, as needed by the particular integration scheme. When the hose extension frame 350 is used, the hoses 225 are connected to the cooling device using a first set of connectors 527 and 529, and are connected to liquid supply via a second set of connectors 525. In this embodiment, the cooling hoses include a first set of houses that are attached to the cooling devices in the cooling frame and a second set of hoses housed within the extension frame. Cooling device connectors 527 and 529 may be standardized for all applications and connects the first set of hoses to the second set of hoses, while liquid supply connectors 525 of the second set of hoses may be interchangeable to fit the particular connectors used in each particular integration scheme.

Figure 6:
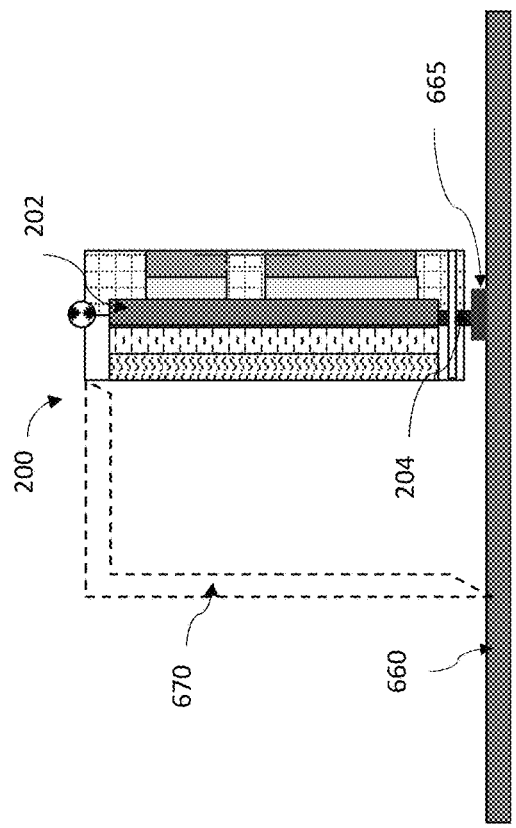
FIG. 6 illustrates an example of a cooling apparatus mounted on a peripheral PCB, which is mounted onto the motherboard, according to an embodiment.
Figure 7:
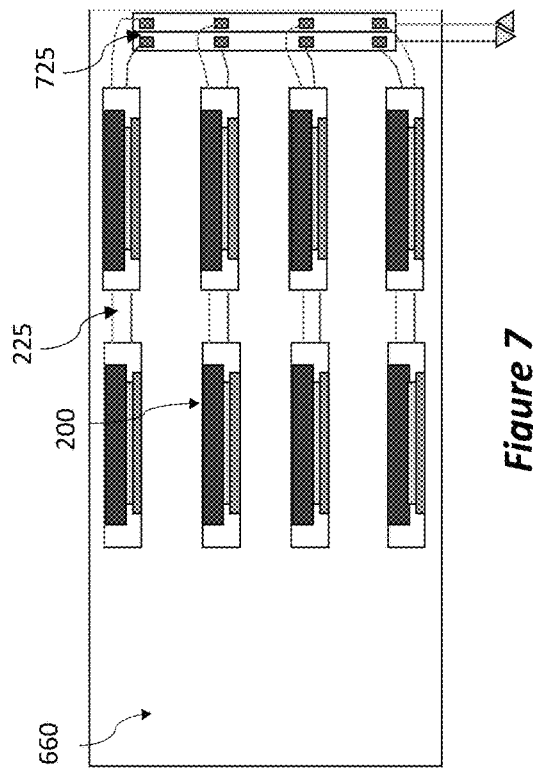
FIG. 7 illustrates an example of integration of individual cooling apparatuses, according to another embodiment.

FIG. 6 illustrates an example of a peripheral board 202 mounted onto a motherboard 660 and is enclosed within the cooling apparatus 200, according to an embodiment. As illustrated, a peripheral interface socket 665 is provided on the motherboard 660. Generally, several such peripheral interface sockets 665 would be provided, as illustrated in FIG. 7. In this respect, the reference herein to motherboard is intended to cover a variety of system boards that host one or more peripheral boards via an interface socket. The peripheral board 202 is mounted onto the motherboard 660 by inserting the interface connector 204 into the peripheral interface socket 665. Optionally, additional mechanical interface 670 may be added to affix the cooling apparatus 200 to the motherboard 660, as illustrated in dash-line.

FIG. 7 illustrates an example wherein several peripheral boards are attached to the motherboard board 660. As shown some of the cooling devices are connected serially with the cooling hoses 225, while other connections are in parallel or connected to a manifold 725. The ability to connect the cooling hoses in different orientation is facilitated by the ability to flip the exit port of the hoses from the cooling frame or the extension frame. Since either side of either frame may be used for hose ports, a port on one side can be used to connect a cooling apparatus to a neighboring cooling apparatus in a serial manner, while the port on the opposite side can be used to connect the cooling apparatus to, e.g., an distribution manifold.

With the above disclosure, a cooling apparatus for a peripheral circuit board is provided, the apparatus comprising a cooling frame and a cushion frame attached to each other by a hinge on one side thereof, the cooling frame having a cooling device mounted thereupon and cooling hoses connected to the cooling devices; the cushion frame having a cushion arrangement configured to exert pressure on the peripheral circuit when assembled; a locking arrangement operable to hold the cooling frame and cushion frame in a closed position wherein the cooling frame and cushion frame define an opening designed to enable a peripheral interface connector to extend there-through. In the closed position the cooling frame contacts the cushion frame and define a housing space to house the peripheral board therein.

In the disclosed embodiments, the cooling frame may include provisions for mounting a hose extension frame, the hose extension frame incorporating a plurality of cooling hoses and at least one anchor holding the hoses. In disclosed embodiments an insulation layer may be applied to the cushion arrangement. The cushion arrangement may be a foam arrangement, a spring arrangement or other resilient arrangement. At least one of the cooling devices may be mounted resiliently onto the cooling frame.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling apparatus configured for cooling a peripheral circuit board having a peripheral device mounted thereon, the cooling apparatus comprising:
   a cooling frame;
   at least one cooling device mounted onto the cooling frame;
   a plurality of cooling hoses connected to the at least one cooling device;
   a hinge attached to one side of the cooling frame;
   a cushion frame rotatably attached on one side to the hinge;
   a cushion arrangement attached to the cushion frame;
   a locking arrangement configured to lock the cooling frame to the cushion frame in a closed position, wherein when the cooling frame is locked to the cushion frame in the closed position:
      the at least one cooling device is in thermal contact with the peripheral device, and
      the at least one cooling device, the peripheral device, and the peripheral circuit board are sandwiched between the cooling frame and the cushion arrangement; and
   a contact layer sandwiched between the cushion arrangement and the peripheral circuit board when the cooling frame is locked to the cushion frame in the closed position.

2. The cooling apparatus of claim 1, wherein the at least one cooling device comprises a liquid cooling plate.

3. The cooling apparatus of claim 1, further comprising an insulation layer provided over the cushion arrangement.

4. The cooling apparatus of claim 1, further comprising a resilient mounting arrangement mounting the at least one cooling device to the cooling frame.

5. The cooling apparatus of claim 4, wherein the resilient mounting arrangement comprises a spring arrangement.

6. The cooling apparatus of claim 1, wherein the cushion arrangement comprises one of foam, interconnected springs, or stamped resilient plate.

7. The cooling apparatus of claim 1, further comprising an extension frame attached to the cooling frame and housing the plurality of cooling hoses.

8. The cooling apparatus of claim 7, further comprising at least one anchor positioned within the extension frame and configured to hold the plurality of cooling hoses.

9. A peripheral system having a liquid-cooled peripheral circuit board, comprising:
   the liquid-cooled peripheral circuit board having a peripheral interface connector and at least one microchip to be actively cooled;
   a housing having an opening that accommodates extension of the peripheral interface connector outside of the housing, the housing comprising:
   a cooling frame and a cushion frame attached to the cooling frame by a hinge;
   a locking mechanism to lock the cooling frame and the cushion frame in a closed position;
   at least one cooling device mounted onto the cooling frame;
   a plurality of cooling hoses connected to the at least one cooling device;
   a cushion arrangement attached to the cushion frame and exerting pressure on the liquid-cooled peripheral circuit board;
   wherein the housing encapsulates the liquid-cooled peripheral circuit board and the at least one cooling device so that:
      the at least one cooling device is in thermal contact with the at least one microchip, and
      the at least one cooling device, the at least one microchip, and the liquid-cooled peripheral circuit board are sandwiched between the cooling frame and the cushion arrangement; and
   a contact layer sandwiched between the cushion arrangement and the liquid-cooled peripheral circuit board when the cooling frame is locked to the cushion frame in the closed position.

10. The peripheral system of claim 9, wherein the cooling frame incorporates air passages.

11. The peripheral system of claim 9, further comprising electrical insulation provided between the liquid-cooled peripheral circuit board and the cushion arrangement.

12. The peripheral system of claim 9, further comprising an extension frame that houses the plurality of cooling hoses.

13. The peripheral system of claim 12, wherein the extension frame comprises at least one anchor for attaching the plurality of cooling hoses.

14. The peripheral system of claim 13, wherein the at least one anchor is movable within the extension frame.

15. The peripheral system of claim 12, wherein the extension frame is removable from the cooling frame, and wherein the plurality of cooling hoses comprises a first set of hoses attached to the at least one cooling device and a second set of hoses positioned inside the extension frame, and wherein the first set of hoses and the second set of hoses further comprise mutual connectors configured for attaching the first set of hoses to the second set of hoses, and wherein the second set of hoses further comprises supply connectors configured for connecting the second set of hoses to a liquid supply system.

16. The peripheral system of claim 15, further comprising at least one clip positioned inside the extension frame and securing the second set of hoses within the extension frame.

17. The peripheral system of claim 12, wherein the extension frame comprises a first hose outlet port on one side and a second outlet port on a second side, opposite the first side.

18. The peripheral system of claim 9, wherein the cushion arrangement comprises one of foam, interconnected springs, or stamped resilient plate.

19. The peripheral system of claim 9, further comprising a resilient mechanism resiliently attaching the at least one cooling device to the cooling frame.

* * * * *